United States Patent
Hammes

(10) Patent No.: US 11,415,650 B2
(45) Date of Patent: Aug. 16, 2022

(54) GRADIENT SYSTEM WITH FLEXIBLE GRADIENT AMPLIFIER

(71) Applicant: Siemens Healthcare GmbH, Erlangen (DE)

(72) Inventor: Martin Hammes, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 162 days.

(21) Appl. No.: 16/993,459

(22) Filed: Aug. 14, 2020

(65) Prior Publication Data
US 2021/0048495 A1 Feb. 18, 2021

(30) Foreign Application Priority Data

Aug. 16, 2019 (EP) .................................. 19192016

(51) Int. Cl.
*G01R 33/385* (2006.01)

(52) U.S. Cl.
CPC ................................ *G01R 33/3852* (2013.01)

(58) Field of Classification Search
CPC ............... G01R 33/385; G01R 33/3852; G01R 33/4818; G01R 33/561
See application file for complete search history.

(56) References Cited

U.S. PATENT DOCUMENTS

| | | | | |
|---|---|---|---|---|
| 5,066,914 A | * | 11/1991 | Vavrek | G01R 33/3852 324/309 |
| 5,182,465 A | * | 1/1993 | Stanley | G01R 33/3852 307/115 |
| 6,201,395 B1 | * | 3/2001 | Stanley | G01R 33/3852 324/322 |
| 6,552,448 B1 | * | 4/2003 | Gegner | H03F 3/20 307/77 |
| 6,900,638 B1 | | 5/2005 | Yair et al. | |
| 2016/0238681 A1 | | 8/2016 | Biber et al. | |
| 2017/0139022 A1 | * | 5/2017 | Lee | G01R 33/3802 |

FOREIGN PATENT DOCUMENTS

| | | |
|---|---|---|
| DE | 60120816 T2 | 1/2007 |
| DE | 102015202670 A1 | 8/2016 |

OTHER PUBLICATIONS

R. Kimmlingen et al.: "An easy to exchange high performance head gradient insert for a 3T whole body MRI system: First results"; Proceedings of the International Society for Magnetic Resonance in Medicine,; ISMRM; 12th Scientific Meeting and Exhibition; Kyoto; Japan; May 15-21, 2004; XP040591571.
European action dated Mar. 10, 2020, for Application No. 19192016.4.

* cited by examiner

*Primary Examiner* — Steven L Yeninas
(74) *Attorney, Agent, or Firm* — Banner & Witcoff Ltd.

(57) ABSTRACT

The disclosure relates to a gradient system comprising a first gradient coil unit, a second gradient coil unit and a flexible gradient amplifier unit, wherein the flexible gradient amplifier unit is configured to actuate the first gradient coil unit and the second gradient coil unit.

19 Claims, 3 Drawing Sheets

Figure 3:
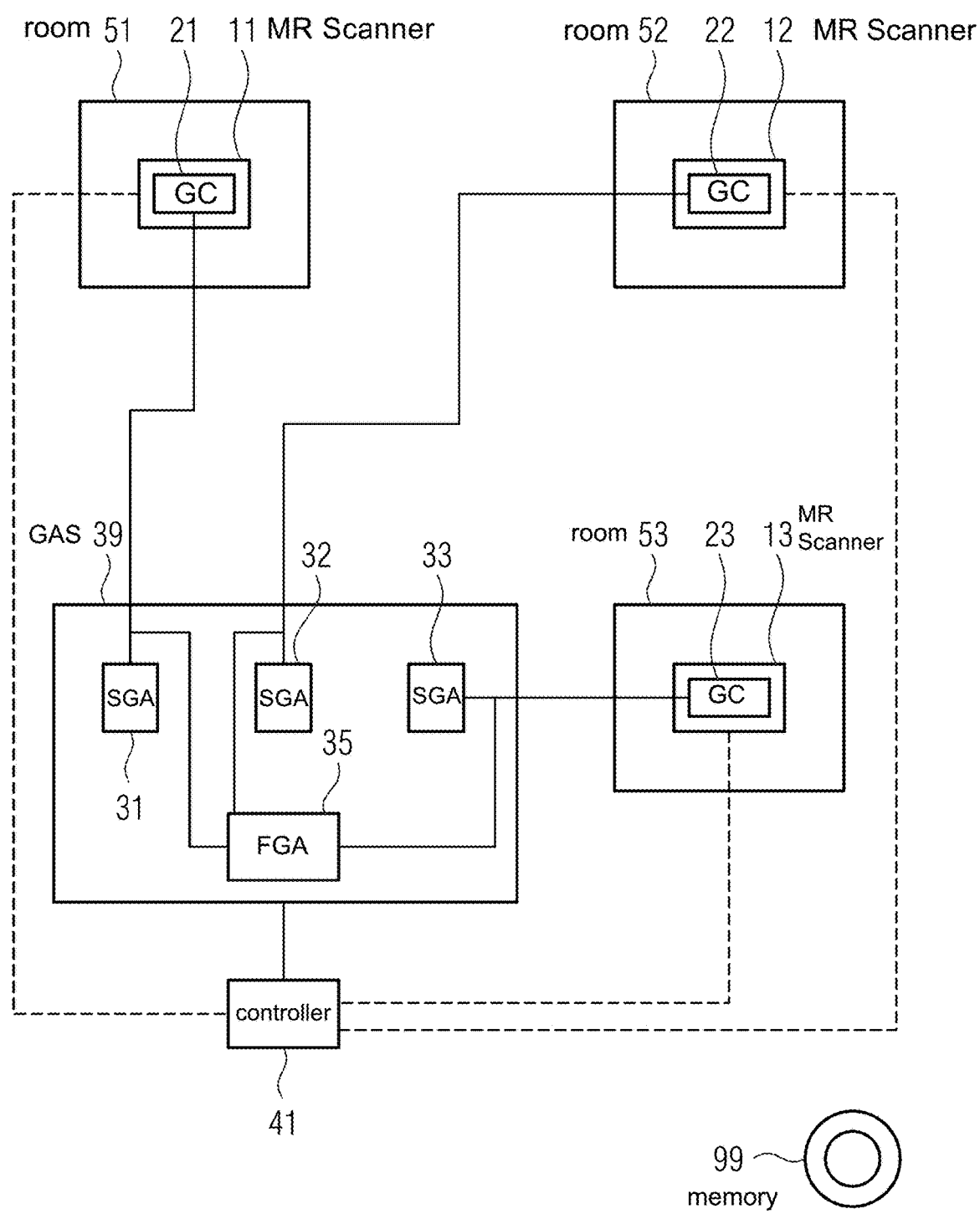

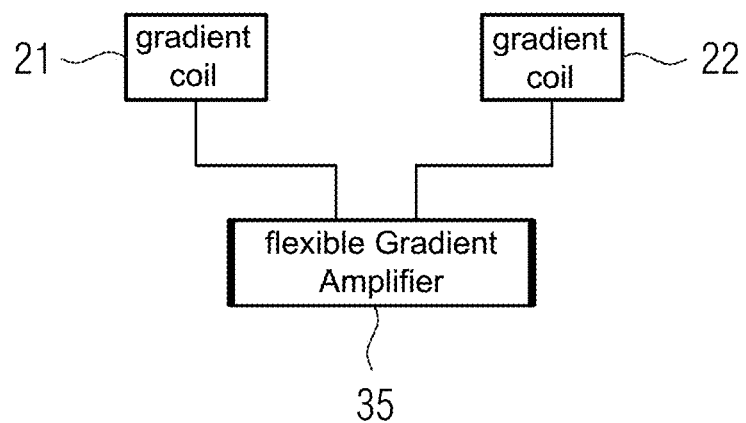
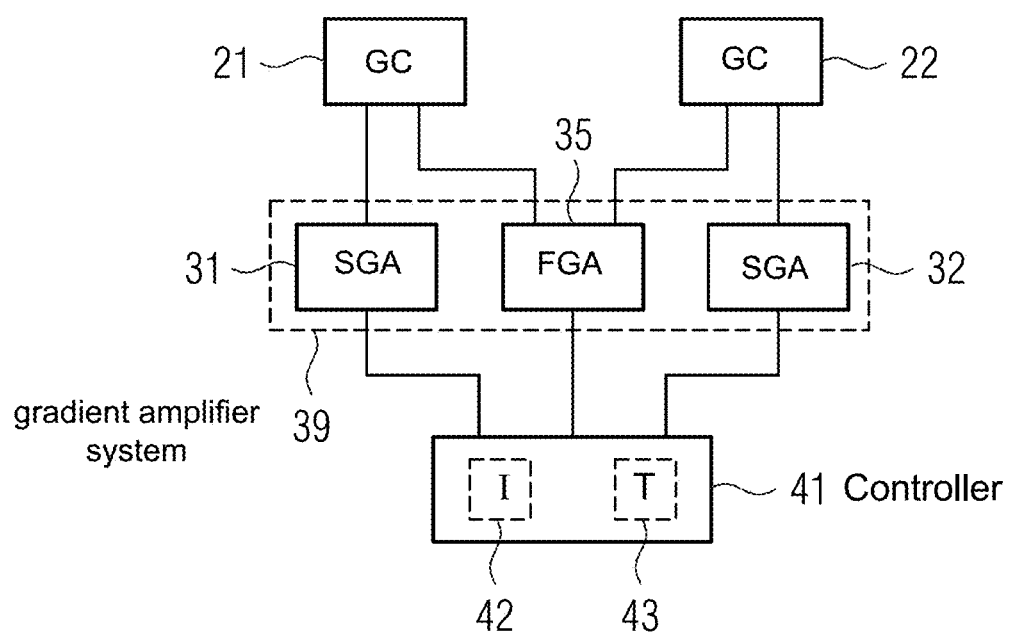

GRADIENT SYSTEM WITH FLEXIBLE GRADIENT AMPLIFIER

CROSS REFERENCE TO RELATED APPLICATIONS

This patent application claims priority to European Patent Application No. 19192016.4, filed Aug. 16, 2019, which is incorporated herein by reference in its entirety.

BACKGROUND

Field

The disclosure relates to a gradient system. The disclosure also relates to an imaging system comprising a gradient system according to the disclosure and two magnetic resonance devices. The disclosure also relates to a method for actuating a gradient system according to the disclosure.

Related Art

In a magnetic resonance device, the body to be examined of an examination object, particularly that of a patient, is typically exposed to a relatively strong main magnetic field of, for example, 1.5 or 3 or 7 tesla, with the aid of a main magnet. In addition, gradient pulses are played out with the aid of a gradient coil unit. High-frequency radio-frequency pulses, for instance excitation pulses, are then transmitted via a radio-frequency antenna unit by means of suitable antenna facilities, with the result that the nuclear spins of particular atoms resonantly excited by these radio-frequency pulses are tilted by a defined flip angle compared to the magnetic field lines of the main magnetic field. When the nuclear spins are relaxed, radio-frequency signals known as magnetic resonance signals, are emitted, and are received and then further processed using suitable radio-frequency antennas. From the raw data acquired in this way, the desired image data can ultimately be reconstructed.

For a particular scan, a particular magnetic resonance control sequence (MR control sequence), also known as a pulse sequence which consists of a sequence of radio-frequency pulses, for example excitation pulses and refocusing pulses, as well as gradient pulses to be transmitted suitably coordinated therewith on various gradient axes along different spatial directions, is therefore to be transmitted. Timed to coincide with this, readout windows are set which define the time periods in which the induced magnetic resonance signals are detected.

A temporally variable electric current, the amplitude of which reaches up to 1.2 kA, is conducted into the gradient coil unit to generate gradient pulses, whereby a magnetic field gradient which is essential for the spatial encoding of the magnetic resonance signals is generated. The magnetic field gradient is subject to rise and fall rates of several 100 T/m/s, which requires a frequent and rapid changing of the current direction. The output of the temporally variable electric current for actuating a gradient coil unit typically takes place at least in two stages, wherein a temporally variable electric control current is initially output, said control current is scaled by a gradient amplifier unit so that the required amplitude is achieved. The greater the amplitude of the magnetic field gradient and/or its rise and fall rates, the higher the required performance of the gradient amplifier unit. A magnetic resonance device is actuated with a plurality of different MR control sequences depending on the contrast to be generated. Typically each magnetic resonance device is directly assigned a gradient amplifier unit which is used to generate all MR control sequences to be played out from the magnetic resonance device. The gradient amplifier unit assigned directly to a magnetic resonance device is conventionally used only for this magnetic resonance device.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 a gradient system according to an exemplary embodiment.

FIG. 2 a gradient system according to an exemplary embodiment.

FIG. 3 an imaging system according to an exemplary embodiment.

Figure 4:
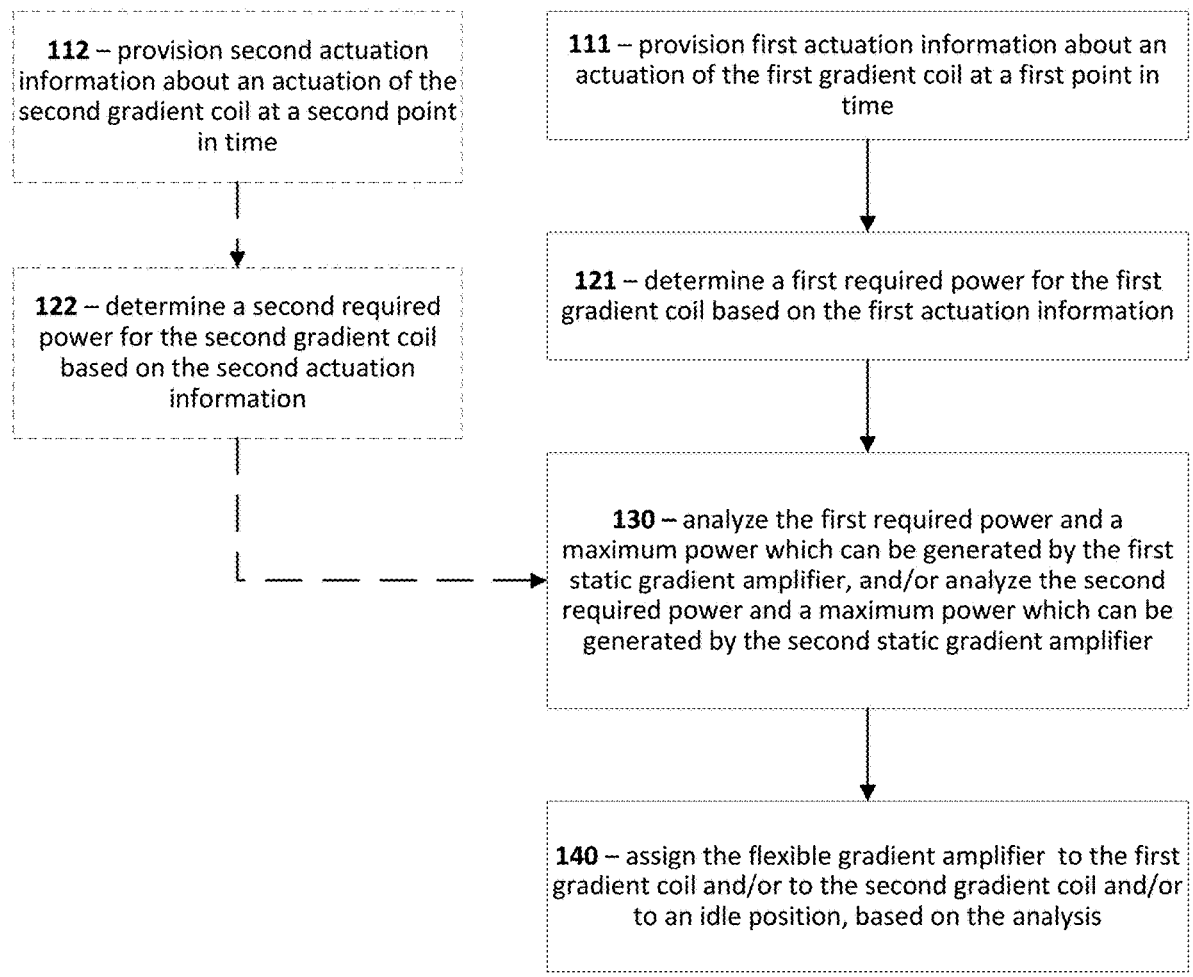

FIG. 4 a flowchart of a method according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to provide an efficient gradient system for at least two gradient coil units and therefore for at least two magnetic resonance devices.

The gradient system according to the disclosure comprises a first gradient coil unit, a second gradient coil unit and a flexible gradient amplifier unit, wherein the flexible gradient amplifier unit is configured to actuate the first gradient coil unit and the second gradient coil unit.

The first gradient coil unit is configured to generate a first magnetic field gradient in a first direction. The second gradient coil unit is configured to generate a second magnetic field gradient in a second direction. If the first gradient coil unit and the second gradient coil unit are comprised in two different magnetic resonance devices and/or the first gradient coil unit and the second gradient coil unit are assigned to two different magnetic resonance devices, the first direction can correspond to the second direction. The first gradient coil unit can be assigned to a first magnetic resonance system. The first gradient coil unit is typically embodied in this case to generate all of the magnetic field gradients to be output from the first magnetic resonance device in the first direction. The second gradient coil unit can be assigned to a second magnetic resonance system. The second gradient coil unit is typically embodied in this case to generate all of the magnetic field gradients to be output from the second magnetic resonance device in the second direction. If the first gradient coil unit and the second gradient coil unit are comprised in the same magnetic resonance device, the first direction typically differs from the second direction.

In an exemplary embodiment, the flexible gradient amplifier unit is configured to selectively actuate the first gradient coil unit or the second gradient coil unit at a defined point in time. In an exemplary embodiment, the flexible gradient amplifier unit is configured to actuate the first gradient coil unit and the second gradient coil unit consecutively. In an exemplary embodiment, the gradient system can comprise more than two gradient coil units, in particular at least three gradient coil units, preferably at least four gradient coil units. The flexible gradient amplifier unit is preferably connected to all of the gradient coil units comprised in the gradient system in such a way that the flexible gradient amplifier unit is configured to actuate these gradient coil units.

In an exemplary embodiment, the flexible gradient amplifier unit comprises at least two capacitors. In an exemplary embodiment, the flexible gradient amplifier unit comprises a cooling apparatus which is configured to transport a cooling medium. The flexible gradient amplifier unit typically has at least one connection for an inflow and/or outflow of a cooling medium. The flexible gradient amplifier unit typically has at least one connection to an electricity supply.

The flexible gradient amplifier unit typically has a flexible interface which is compatible with a first interface from the first gradient coil unit and with a second interface from the second gradient coil unit. The flexible interface can have a detachable connection with the first interface and/or with the second interface.

The flexible gradient amplifier unit can have two flexible interfaces, whereby one of which can be connected to the first interface and one to the second interface, preferably detachably connected. The number of flexible interfaces comprised in the flexible gradient amplifier unit typically corresponds to at least the number of gradient coil units which can be connected to the flexible gradient amplifier unit.

The advantage of the gradient system according to the disclosure is that the flexible gradient amplifier unit is not assigned to precisely one defined gradient coil unit and/or precisely one defined magnetic resonance device. The flexible gradient amplifier unit is rather suited to selectively actuating different gradient coil units and/or different magnetic resonance devices. In particular, the flexible gradient amplifier unit can be connected as required to further gradient coil units and/or can be used for actuating further gradient coil units. The flexible gradient amplifier unit can therefore be used according to requirements. This allows an efficient use of the flexible gradient amplifier unit and therefore an efficient use of the gradient system.

In an exemplary embodiment of the gradient system, the gradient system has a planning unit (controller) comprising a planning input (detector). In an exemplary embodiment, the planning input is configured to detect a first actuation information about an actuation of the first gradient coil unit at a first point in time and/or a second actuation information via an actuation of the second gradient coil unit at a second point in time. The planning input can be referred to as a detector. In an exemplary embodiment, the planning unit is configured, based on the first actuation information and/or the second actuation information, to perform an assignment of the flexible gradient amplifier unit at the first point in time and/or at the second point in time to the first gradient coil unit and/or to the second gradient coil unit. In this example, the planning unit controls the assignment of the flexible gradient amplifier unit and can be referred to as a controller.

The first point in time is typically a future point in time. The second point in time is typically a future point in time.

An actuation of the first gradient coil unit and/or of the second gradient coil unit comprises a playing out of gradient pulses in the context of an MR control sequence.

A first MR control sequence typically comprises a first actuation information about an actuation of the first gradient coil unit at a first point in time. The first MR control sequence typically provides for the actuation of a first magnetic resonance device assigned to the first gradient coil unit at the first point in time. The first actuation information can typically be extracted from the first MR control sequence.

A second MR control sequence typically comprises a second actuation information about an actuation of the second gradient coil unit at a second point in time.

The second MR control sequence typically provides for the actuation of a second magnetic resonance device assigned to the second gradient coil unit at the second point in time. The second actuation information can typically be extracted from the second MR control sequence.

The first actuation information and/or the second actuation information can be transmitted to the planning input from a control unit, said control unit comprising information regarding future MR control sequences to be output from the first and/or second magnetic resonance device. Detecting the first actuation information can comprise a provision of the first MR control sequence and an extraction of the first actuation information from the first MR control sequence. Detecting the second actuation information can comprise a provision of the second MR control sequence and an extraction of the second actuation information from the second MR control sequence.

The assignment of the flexible gradient amplifier unit at the first point in time to the first gradient coil unit typically comprises an initiation of an actuation of the first gradient coil unit at the first point in time by the flexible gradient amplifier unit. The assignment of the flexible gradient amplifier unit at the second point in time to the second gradient coil unit typically comprises an initiation of an actuation of the second gradient coil unit at the second point in time by the flexible gradient amplifier unit.

In an exemplary embodiment, the planning unit (controller) is configured to define a use of the flexible gradient amplifier unit at the first point in time and/or at the second point in time. In this way, the first actuation information and/or the second actuation information is typically taken into account dynamically.

A first actuation information for a first period of time comprising the first point in time for the first gradient coil unit can for example be made available to the planning unit by means of the planning input. The first actuation information typically comprises the gradient pulses to be played out within the first period of time in the context of a first MR control sequence from a first magnetic resonance device assigned to the first gradient coil unit.

If no further use of the flexible gradient amplifier unit is foreseen during the first period of time, i.e. no actuation of another gradient coil unit, for example of the second gradient coil unit by the flexible amplifier unit, the planning unit typically assigns the flexible gradient amplifier unit to the first gradient coil unit.

A second actuation information for a second period of time comprising the second point in time for the second gradient coil unit can for example be made available to the planning unit by means of the planning input. The second actuation information typically comprises the gradient pulses to be played out within the second period of time in the context of a second MR control sequence from a second magnetic resonance device assigned to the second gradient coil unit. If the first period of time overlaps with the second period of time, the planning unit can be configured, taking other factors into account, to assign the flexible gradient amplifier unit to the first gradient coil unit for the first period of time or to the second gradient coil unit for the second period of time.

In an exemplary embodiment, the planning unit (controller) can for example be configured to assign the flexible gradient amplifier unit for playing out a first MR control sequence at the first point in time to the first gradient coil unit. The second gradient coil unit is then typically not actuated at the first point in time by the flexible gradient amplifier unit.

In an exemplary embodiment, the planning unit comprises a communication unit configured to generate and transmit information regarding the assignment of the flexible gradient amplifier unit at the first point in time and/or at the second point in time to the first magnetic resonance device and/or the second magnetic resonance device and/or the first gradient coil unit and/or the second gradient coil unit and/or the control unit. In particular the information regarding the assignment comprises a property comprising an availability of the flexible gradient amplifier unit at a point in time.

Taking into consideration the first actuation information and/or the second actuation information allows an efficient use of only one gradient amplifier unit, the flexible gradient amplifier unit, taking particularly good account of the requirements of the gradient system. This embodiment therefore facilitates a continuous operation of both gradient coil units, in particular of both magnetic resonance systems.

An embodiment of the gradient system provides that the planning unit is configured to initiate an actuation of the first gradient coil unit and/or the second gradient coil unit by the flexible gradient amplifier unit according to the assignment. This allows an efficient realization of the planned use of the flexible gradient amplifier unit.

An embodiment of the gradient system provides that the planning unit comprises a testing unit (detector) which is configured to detect at least a first specification for the first gradient coil unit and to ensure compliance with the first specification upon actuation of the first gradient coil unit by the flexible gradient amplifier unit. The first specification can be made available to the planning unit, in particular to the testing unit, by means of a communication unit comprised in the planning unit and/or a planning input comprised in the planning unit.

A gradient amplifier unit typically induces an electric current and/or an electrical voltage within a gradient coil unit to generate a magnetic field gradient. Depending on the configuration of the gradient coil unit, a maximum electric current and/or a maximum electrical voltage is typically permitted. The first specification typically comprises a maximum permitted electric current and/or a maximum permitted electrical voltage and/or a maximum rise and fall rate for the first gradient coil unit.

The flexible gradient amplifier unit can be configured to operate the first gradient coil unit outside of the first specification. This can however damage the first gradient coil unit. The testing unit can therefore ensure that an electric current and/or electrical voltage output from the flexible gradient amplifier unit to the first gradient coil unit lies within the first specification.

This embodiment prevents damage to the first gradient coil unit as a result of an actuation by the flexible gradient amplifier unit.

An embodiment of the gradient system provides that the first gradient coil unit and the second gradient coil unit are arranged within a building.

In particular the gradient system is arranged within a building. The gradient system is preferably arranged within a clinical operation. The spatial distance between the first gradient coil unit and the second gradient coil unit is typically less than 250 m, preferably less than 100 m, particularly preferably less than 50 m. The first gradient coil unit, the second gradient coil unit and the flexible gradient amplifier unit are preferably arranged in different rooms from one another. The first gradient coil unit, the second gradient coil unit and the flexible gradient amplifier unit are preferably arranged in rooms which are at least partially adjacent to one another.

A plurality of magnetic resonance devices and/or gradient coil units used within a clinical operation can therefore benefit from the one gradient amplifier unit which can be used flexibly. As a result the magnetic resonance devices and/or gradient coil units can be operated particularly cost-effectively.

An embodiment of the gradient system provides that the gradient system comprises a first static gradient amplifier unit and a second static gradient amplifier unit and the first static gradient amplifier unit is assigned to the first gradient coil unit and the second static gradient amplifier unit is assigned to the second gradient coil unit.

A gradient coil unit is usually assigned exactly one static gradient amplifier unit. In the context of this embodiment of the gradient system, the first static gradient amplifier unit is typically connected to the first gradient coil unit in such a way that the first static gradient amplifier unit is embodied only for actuating the first gradient coil unit. The first static gradient amplifier unit is typically only embodied for actuating another gradient coil unit rather than the first gradient coil unit if the first static gradient amplifier unit is connected manually, typically by a technically trained specialist, to the other gradient coil unit rather than the first gradient coil unit.

In the context of this embodiment of the gradient system, the second static gradient amplifier unit is typically connected to the second gradient coil unit in such a way that the second static gradient amplifier unit is embodied only for actuating the second gradient coil unit. The second static gradient amplifier unit is typically only embodied for actuating another gradient coil unit rather than the second gradient coil unit if the second static gradient amplifier unit is connected manually, typically by a technically trained specialist, to the other gradient coil unit rather than the second gradient coil unit.

The first static gradient amplifier unit and/or the second static gradient amplifier unit can correspond to a conventional gradient amplifier unit. In particular the first static gradient amplifier unit and/or the second static gradient amplifier unit comprise interfaces which allow a data transfer with a control unit and/or with the flexible interface.

This embodiment allows an actuation of the first gradient coil unit by the first static gradient amplifier unit and/or the flexible gradient amplifier unit.

This embodiment allows an actuation of the second gradient coil unit by the second static gradient amplifier unit and/or the flexible gradient amplifier unit. This allows a use of the flexible gradient amplifier unit depending on a type of actuation of the first gradient coil unit and/or of the second gradient coil unit. In particular the flexible gradient amplifier unit can be used depending on a required performance. In this way a gradient system can be designed particularly cost-effectively.

An embodiment of the gradient system provides that a maximum power which can be generated by the flexible gradient amplifier unit is greater than a maximum power which can be generated by the first static gradient amplifier unit and that a maximum power which can be generated by the flexible gradient amplifier unit is greater than a maximum power which can be generated by the second static gradient amplifier unit.

The maximum power which can be generated by a gradient amplifier unit can for example be a measure for the maximum electrical voltage and/or the maximum electric current strength in a gradient coil unit connected to the gradient amplifier unit. The maximum power which can be generated by a gradient amplifier unit can for example be a measure for the maximum rise and fall rate of a magnetic field gradient generated by a gradient coil unit connected to the gradient amplifier unit.

A power can for example be a measure for an electrical voltage and/or an electric current strength in a gradient coil unit and/or a rise and fall rate of a magnetic field gradient generated by a gradient coil unit. It has been recognized that in the case of approximately 90% of the examinations and/or MR control sequences performed in the clinical operation a power is required which represents less than 50%, typically less than 30% and/or 20% of the maximum power. The maximum power can therefore be defined as the maximum permitted power for a gradient coil unit. A static gradient amplifier unit which is directly assigned to a gradient coil unit is conventionally configured to generate this maximum power.

MR control sequences which are frequently used but typically require less than 30% of the maximum power are, for example, spin-echo based MR control sequences. An MR control sequence which, for example, requires at least 80% of the maximum power is an EPI.

This embodiment provides that the first static gradient amplifier unit and the second static gradient amplifier unit are embodied for a lower maximum power than the flexible gradient amplifier unit. The maximum power which can be generated by the first static gradient amplifier unit and/or the second static gradient amplifier unit is typically less than 80%, preferably less than 60%, particularly preferably less than 40% of the maximum power of the first gradient coil unit and/or second gradient coil unit.

The flexible gradient amplifier unit is therefore required to actuate the first gradient coil unit and/or the second gradient coil unit with a power greater than the maximum power which can be generated by the first static gradient amplifier unit and/or second static gradient amplifier unit.

This embodiment allows a continuous use of all gradient coil units included in the gradient system with low power. If an actuation of a gradient coil unit with high power, for example in the context of an EPI, is planned, the flexible gradient amplifier unit is used to actuate this gradient coil unit.

In this way an expensive component, such as the flexible gradient amplifier unit, can be better utilized. The static gradient amplifier units can be manufactured cost-effectively, thus positively impacting the overall price of the gradient system in particular in the case of a higher number of gradient coil units. In particular when combining this embodiment with the planning unit a particularly efficient actuation of the static gradient amplifier units and of the flexible gradient amplifier unit can take place. In addition the flexible gradient amplifier unit can be retrofitted to existing gradient systems. The flexible gradient amplifier unit can be easily exchanged and can in particular be exchanged for a new, more powerful flexible gradient amplifier unit if necessary.

A gradient coil unit can likewise be configured independently of the assigned static gradient amplifier unit, in particular for a higher power. The magnetic resonance device assigned to the gradient coil unit can therefore be improved, for example as regards image data generated by said magnetic resonance device.

The imaging system according to the disclosure comprises a gradient system according to the disclosure, a first magnetic resonance device and a second magnetic resonance device, wherein the first magnetic resonance device is assigned the first gradient coil unit and the second magnetic resonance device is assigned the second gradient coil unit.

The first magnetic resonance device and the second magnetic resonance device are preferably connected to a communication unit included in the planning unit.

A general mode of operation of a magnetic resonance device, i.e. of the first magnetic resonance device and of the second magnetic resonance device, is known to the person skilled in the art, so that a detailed description of the further components is not included. The first magnetic resonance device typically comprises the first gradient coil unit. The second magnetic resonance device typically comprises the second gradient coil unit.

Embodiments of the imaging system according to the disclosure are embodied similarly to the embodiments of the gradient system according to the disclosure.

The inventive method for actuating a gradient system according to the disclosure also comprising a first static gradient amplifier unit and a second static gradient amplifier unit, wherein the first static gradient amplifier unit is assigned to the first gradient coil unit and the second static gradient amplifier unit is assigned to the second gradient coil unit, provides for the following method steps:

Provision of a first actuation information about an actuation of the first gradient coil unit at a first point in time, determination of a first required power for the first gradient coil unit based on the first actuation information, analysis comprising a first comparison of the first required power and a maximum power which can be generated by the first static gradient amplifier unit, assignment of the flexible gradient amplifier unit to the first gradient coil unit and/or to the second gradient coil unit and/or in an idle position depending on the analysis.

The assignment depending on the analysis typically provides that in the event of the maximum power which can be generated by the first static gradient amplifier unit being exceeded by the first required power, the flexible gradient amplifier unit is assigned to the first gradient coil unit for actuating the first gradient coil unit according to the first actuation information.

The assignment depending on the analysis typically provides that in the event of the maximum power which can be generated by the first static gradient amplifier unit not being reached by the first required power, the first static gradient amplifier unit is assigned to the first gradient coil unit for actuating the first gradient coil unit according to the first actuation information and/or the flexible gradient amplifier unit is assigned in an idle position.

The assignment depending on the analysis typically takes place in a time-dependent manner and/or specifically for the first point in time.

The analysis can also comprise a third comparison of the first required power and a maximum power which can be generated by the flexible gradient amplifier unit. If the maximum power which can be generated by the flexible gradient amplifier unit is exceeded by the first required power, the flexible gradient amplifier unit can be assigned in an idle position.

The method preferably provides as a further method step that an information regarding the assignment and/or use of the flexible gradient amplifier unit at the first point in time is made available to a control unit and/or the first magnetic resonance device and/or the second magnetic resonance device. This information can also include a reservation of the flexible gradient amplifier unit at the first point in time for the first gradient coil unit.

The method allows a particularly efficient use of a gradient system according to the disclosure. In particular depending on the first actuation information for the first gradient coil unit the correct gradient amplifier unit can be selected, in particular the flexible gradient amplifier unit or the first static gradient amplifier unit, and can be used for actuating the first magnetic resonance device and/or the first gradient coil unit.

An embodiment of the method provides that the assignment includes a temporal shift of the first point in time. The analysis preferably comprises a check on the availability of the flexible gradient amplifier unit at the first point in time. If the comparison shows that the maximum power which can be generated by the first static gradient amplifier unit has been exceeded by the first required power and if the check shows that the flexible gradient amplifier unit is not available at the first point in time, the first point in time, in particular an actuation of the first gradient coil unit according to the first actuation information, can be temporally shifted, the actuation of the first gradient coil unit according to the first actuation information can therefore take place at an alternative time to the first point in time. Alternatively the actuation of the first gradient coil unit can take place at the first point in time according to a further actuation information which differs from the first actuation information. This embodiment allows a flexible and adaptive use of the flexible gradient amplifier unit.

An embodiment of the method provides that the method also comprises the following method steps:

Provision of a second actuation information about an actuation of the second gradient coil unit at a second point in time Determination of a second required power for the second gradient coil unit based on the second actuation information and the analysis comprises a second comparison of the second required power with a maximum power which can be generated by the second static gradient amplifier unit and takes place taking into consideration the first point in time and the second point in time.

For example, if the second required power exceeds the maximum power which can be generated by the second static gradient amplifier unit and if the first required power is below the maximum power which can be generated by the first static gradient amplifier unit, the flexible gradient amplifier unit can be assigned to the second gradient coil unit at the second point in time. For example, if the second required power exceeds the maximum power which can be generated by the second static gradient amplifier unit and if the first required power exceeds the maximum power which can be generated by the first static gradient amplifier unit, the flexible gradient amplifier unit can be assigned depending on the first point in time and the second point in time to the second gradient coil unit and/or the first gradient coil unit. This allows a particularly efficient use of the flexible gradient amplifier unit.

An embodiment of the method provides that the assignment includes a temporal shift of the second point in time. Analogously to the first point in time, the second point in time can also be shifted.

A computer program product according to the disclosure is directly loadable into a memory unit of the programmable planning unit and has program code means in order to carry out an inventive method when the computer program product is executed in the planning unit. This means the inventive method can be performed quickly and robustly, and can be identically repeated. The computer program product is configured such that it can perform by means of the planning unit the method steps according to the disclosure. Therefore, the planning unit must have the necessary specifications such as, for example, a suitable RAM, a suitable graphics card or a suitable logic unit, in order to be able to perform the respective method steps efficiently. The computer program product is stored, for example, on an electronically readable medium or is deposited on a network or server from where it can be loaded into the processor of a local planning unit which can be directly connected to the gradient system or embodied as part of the gradient system. Furthermore, control information of the computer program product can be stored on an electronically readable data carrier. The control information of the electronically readable data carrier can be designed such that when the data carrier is used in a planning unit of a gradient system it can perform an inventive method. Examples of electronically readable data carriers are a DVD, a magnetic tape or a USB stick, on which electronically readable control information, in particular software, is stored. If this control information (software) is read from the data carrier and stored in a control unit and/or planning unit of a gradient system, all inventive embodiments of the methods described above can be performed.

Furthermore the disclosure is based on an electronically readable data carrier (e.g. memory) on which a program is stored which is provided for carrying out a method for actuating a gradient system according to the disclosure additionally comprising a first static gradient amplifier unit and a second static gradient amplifier unit, wherein the first static gradient amplifier unit is assigned to the first gradient coil unit and the second static gradient amplifier unit is assigned to the second gradient coil unit.

The advantages of the inventive imaging system, of the inventive method, of the inventive computer program product and of the inventive electronically readable data carrier correspond substantially to the advantages of the inventive gradient system, which are explained in detail above. Features, advantages or alternative embodiments mentioned here can likewise also be transferred to the other aspects and vice versa.

FIG. 1 shows a schematic representation of a first embodiment of an inventive gradient system. The gradient system comprises a first gradient coil unit 21 (first gradient coil), a second gradient coil unit 22 (second gradient coil) and a flexible gradient amplifier unit 35 (flexible gradient amplifier). The flexible gradient amplifier unit 35 is configured to actuate the first gradient coil unit 21 and the second gradient coil unit 22.

FIG. 2 shows a schematic representation of a second embodiment of an inventive gradient system.

In an exemplary embodiment, the gradient system comprises a first static gradient amplifier unit 31 and a second static gradient amplifier unit 32. The first static gradient amplifier unit 31 is assigned to the first gradient coil unit 21. The second static gradient amplifier unit 32 is assigned to the second gradient coil unit 22. A maximum power which can be generated by the flexible gradient amplifier unit 35 is greater than a maximum power which can be generated by the first static gradient amplifier unit 31. A maximum power which can be generated by the flexible gradient amplifier unit 35 is greater than a maximum power which can be generated by the second static gradient amplifier unit 32. The first static gradient amplifier unit 31, the second static gradient amplifier unit 32 and the flexible gradient amplifier unit 35 together form the overall gradient amplifier unit 39.

In an exemplary embodiment, the gradient system also comprises a planning unit 41 (controller 41) comprising a planning input 42 (detector 42). The planning input 42 is configured to detect a first actuation information about an actuation of the first gradient coil unit 21 at a first point in time and/or a second actuation information about an actuation of the second gradient coil unit 22 at a second point in time. Based on the first actuation information and/or the second actuation information, the planning unit 41 is configured to perform an assignment of the flexible gradient amplifier unit 35 at the first point in time and/or at the second point in time to the first gradient coil unit 21 and/or to the second gradient coil unit 22. In an exemplary embodiment, the planning unit 41 is connected to the first static gradient amplifier unit 31, the second static gradient amplifier unit 32 and the flexible gradient amplifier unit 35. In an exemplary embodiment, the planning unit 41 is embodied, depending on the first actuation information and/or the second actuation information, to initiate an actuation of the first gradient coil unit 21 at the first point in time by the first static gradient amplifier unit 31 or the flexible gradient amplifier unit 35.

In an exemplary embodiment, the planning unit 41 is configured, depending on the first actuation information and/or the second actuation information, to initiate an actuation of the second gradient coil unit 22 at the second point in time by the second static gradient amplifier unit 32 or the flexible gradient amplifier unit 35.

In an exemplary embodiment, the planning unit 41 is configured, depending on the first actuation information and/or the second actuation information and/or the first point in time and/or the second point in time, to initiate an actuation of the first gradient coil unit 21 at an alternative point in time to the first point in time and/or of the second gradient coil unit 22 at an alternative point in time to the second point in time.

In an exemplary embodiment, the planning unit 41 further includes a testing unit 43 (analyzer 43) which is configured to detect at least a first specification for the first gradient coil unit 21, and to ensure compliance with the first specification upon actuation of the first gradient coil unit by the flexible gradient amplifier unit. In an exemplary embodiment, the testing unit 43 is also configured to detect a second specification for the second gradient coil unit 22, and to ensure compliance with the second specification upon actuation of the second gradient coil unit 22 by the flexible gradient amplifier unit 35.

In an exemplary embodiment, the gradient system includes processor circuitry that is configured to perform one or more functions and/or operations of the gradient system. For example, one or more of the components of the gradient system can include processor circuitry that is configured to perform the respective functions/operations of the component(s).

FIG. 3 shows a schematic representation of an embodiment of an inventive imaging system.

The imaging system comprises a first magnetic resonance device 11, comprising a first gradient coil unit 21, which is arranged within a first room 51.

The imaging system comprises a second magnetic resonance device 12, comprising a second gradient coil unit 22, which is arranged within a second room 52.

The imaging system comprises a third magnetic resonance device 13, comprising a third gradient coil unit 23, which is arranged within a third room 53. The first room 51, the second room 52 and/or the third room 53 are each preferably RF-shielded rooms.

The first static gradient amplifier unit 31 is assigned to the first magnetic resonance device 11. The first gradient coil unit 21 is connected to the first static gradient amplifier unit 31, preferably via a first performance interface. The second static gradient amplifier unit 32 is assigned to the second magnetic resonance device 12. The second gradient coil unit 22 is connected to the second static gradient amplifier unit 32, preferably via a second performance interface. The third static gradient amplifier unit 33 is assigned to the third magnetic resonance device 13. The third gradient coil unit 23 is connected to the third static gradient amplifier unit 33, preferably via a third performance interface.

The flexible gradient amplifier unit 35 is connected to the first magnetic resonance device 11, in particular to the first gradient coil unit 21. For this purpose the flexible gradient amplifier unit 35 can have a separate connection to the first gradient coil unit 21. The flexible gradient amplifier unit 35 can also couple onto the first performance interface. Wires, in particular cables, which connect the first gradient coil unit 21 to the first static gradient amplifier unit 31, can therefore for example be used at least partially for a connection between the first gradient coil unit 21 and the flexible gradient amplifier unit 35.

The flexible gradient amplifier unit 35 is connected to the second magnetic resonance device 12, in particular to the second gradient coil unit 22. For this purpose the flexible gradient amplifier unit 35 can have a separate connection to the second gradient coil unit 22. The flexible gradient amplifier unit 35 can also couple onto the second performance interface. Wires, in particular cables, which connect the second gradient coil unit 22 to the second static gradient amplifier unit 32, can therefore for example be used at least partially for a connection between the second gradient coil unit 22 and the flexible gradient amplifier unit 35.

The flexible gradient amplifier unit 35 is connected to the third magnetic resonance device 13, in particular to the third gradient coil unit 23. For this purpose the flexible gradient amplifier unit 35 can have a separate connection to the third gradient coil unit 23. The flexible gradient amplifier unit 35 can also couple onto the third performance interface. Wires, in particular cables, which connect the third gradient coil unit 23 to the third static gradient amplifier unit 33, can therefore for example be used at least partially for a connection between the third gradient coil unit 23 and the flexible gradient amplifier unit 35.

The first static gradient amplifier unit 31, the second static gradient amplifier unit 32, the third static gradient amplifier unit 33 and the flexible gradient amplifier unit 35 together form the overall gradient amplifier unit 39. The overall gradient amplifier unit 39 is connected to the planning unit 41. The planning unit 41 can be embodied analogously to the planning unit shown in FIG. 2.

The overall gradient amplifier unit 39 is preferably arranged outside the first room 51 and/or the second room 52 and/or the third room 53. The overall gradient amplifier unit 39 is preferably arranged within a room. A cooling and a supply with voltage are required for operation of the first static gradient amplifier unit 31, the second static gradient amplifier unit 32, the third static gradient amplifier unit 33 and the flexible gradient amplifier unit 35. If the overall gradient amplifier unit 39 is arranged within a room, the supply by means of coolant and voltage can take place centrally. This increases the efficiency of the overall gradient amplifier unit 39 and simplifies its maintenance. The planning unit 41 can also be arranged within this room. The first room 51 and/or the second room 52 and/or the third room 53 are typically arranged within a building and/or within a clinical operation.

The planning unit 41 is configured to detect first actuation information about an actuation of the first gradient coil unit 21 at a first point in time. To this end, the planning unit 41 can be connected to the first magnetic resonance device 11 and/or to a control unit (not shown in further detail) for the first magnetic resonance device 11. The planning unit 41 is configured to detect second actuation information about an actuation of the second gradient coil unit 22 at a second point in time. To this end, the planning unit 41 can be connected to the second magnetic resonance device 12 and/or to a control unit (not shown in further detail) for the second magnetic resonance device 12. The planning unit 41 is configured to detect third actuation information about an actuation of the third gradient coil unit 23 at a third point in time. The third point in time is typically a future point in time. To this end, the planning unit 41 can be connected to the third magnetic resonance device 13 and/or to a control unit (not shown in further detail) for the third magnetic resonance device 13.

The planning unit 41 is embodied, depending on the first actuation information and/or the second actuation information and/or the third actuation information, to trigger an actuation of the first magnetic resonance device 11 by the first static gradient amplifier unit 31 or the flexible gradient amplifier unit 35. The planning unit 41 is embodied, depending on the first actuation information and/or the second actuation information and/or the third actuation information, to trigger an actuation of the second magnetic resonance device 12 by the second static gradient amplifier unit 32 or the flexible gradient amplifier unit 35. The planning unit 41 is embodied, depending on the first actuation information and/or the second actuation information and/or the third actuation information, to trigger an actuation of the third magnetic resonance device 13 by the third static gradient amplifier unit 33 or the flexible gradient amplifier unit 35.

The planning unit 41 is embodied, depending on the first actuation information and/or second actuation information and/or third actuation information, to select a gradient amplifier unit comprised in the overall gradient amplifier unit 39 for actuating the first gradient coil unit 21 and/or the second gradient coil unit 22 and/or the third gradient coil unit 23.

In an exemplary embodiment, the imaging system includes processor circuitry that is configured to perform one or more functions and/or operations of the imaging system. For example, one or more of the components of the imaging system (e.g. the gradient system, or one or more components of the gradient system) can include processor circuitry that is configured to perform the respective functions/operations of the component(s).

FIG. 4 shows a flow diagram of an embodiment of a method according to the disclosure for actuating a gradient system.

The method begins with method step 111, the provision of a first actuation information about an actuation of the first gradient coil unit 21 at a first point in time. In the following method step 121 the determination of a first required power for the first gradient coil unit 21 based on the first actuation information takes place. In method step 130 an analysis comprising a first comparison of the first required power and a maximum power which can be generated by the first static gradient amplifier unit 31 takes place. The following method step 140 depending on the analysis provides for an assignment of the flexible gradient amplifier unit 35 to the first gradient coil unit 21 and/or to the second gradient coil unit 22 and/or to an idle position.

As an option in method step 112, a provision of a second actuation information about an actuation of the second gradient coil unit 22 at a second point in time can take place. Based on the second actuation information a determination of a second required power for the second gradient coil unit 22 takes place in method step 122. This second required power is taken into consideration as part of the analysis in the context of the method step 130 by a second comparison of the second required power with a maximum power which can be generated by the second static gradient amplifier unit 32. In the context of method step 130 the analysis also takes place taking the second point in time into consideration. The assignment of the flexible gradient amplifier unit 35 to the first gradient coil unit 21 and/or to the second gradient coil unit 22 and/or to an idle position can also include a temporal shift of the first point in time and/or of the second point in time.

A method for actuating a gradient system can also exist in the form of a computer program product which implements the method on the planning unit 41 and/or the gradient system when it is executed on the planning unit 41. An electronically readable data carrier 99 with electronically readable control information stored thereon can also be provided, said control information comprising a computer program product such as just described and being configured, on use of the data carrier 99 in a planning unit 41, to carry out the method described.

Although the disclosure has been illustrated and described in detail by the preferred exemplary embodiments, the disclosure is not restricted by the examples disclosed and other variations can be derived therefrom by a person skilled in the art without departing from the protective scope of the disclosure.

Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A gradient system comprising:
a first gradient coil;
a first static gradient amplifier assigned to the first gradient coil;
a second gradient coil, wherein the first gradient coil and the second gradient coil are arranged within different respective rooms of a building;
a second static gradient amplifier assigned to the second gradient coil; and
a flexible gradient amplifier configured to selectively actuate the first gradient coil and the second gradient coil.

2. The gradient system as claimed in claim 1, further comprising a controller having a detector, wherein:
the detector is configured to detect first actuation information corresponding to an actuation of the first gradient coil at a first point in time and/or second actuation information corresponding to an actuation of the second gradient coil at a second point in time, and
the controller is configured to, based on the first actuation information and/or the second actuation information, assign the flexible gradient amplifier, at the first point in time, to the first gradient coil, and/or, at the second point in time to the second gradient coil.

3. The gradient system as claimed in claim 2, further comprising an analyzer configured to detect at least a first specification for the first gradient coil, and to ensure compliance with the first specification upon actuation of the first gradient coil by the flexible gradient amplifier.

4. The gradient system as claimed in claim 1, wherein:
a maximum power which can be generated by the flexible gradient amplifier is greater than a maximum power which can be generated by the first static gradient amplifier; and
the maximum power which can be generated by the flexible gradient amplifier is greater than a maximum power which can be generated by the second static gradient amplifier.

5. The gradient system as claimed in claim 1, wherein the first static gradient amplifier is configured to exclusively actuate the first gradient coil unit and the second static gradient amplifier is configured to exclusively actuate the second gradient coil.

6. An imaging system comprising:
a gradient system including:
a first gradient coil;
a second gradient coil; and
a flexible gradient amplifier configured to selectively actuate the first gradient coil and the second gradient coil;
a first magnetic resonance device; and
a second magnetic resonance device, wherein the first magnetic resonance device is assigned to the first gradient coil and the second magnetic resonance device is assigned to the second gradient coil.

7. The imaging system as claimed in claim 6, wherein the gradient system further comprises a controller configured to:
detect first actuation information corresponding to an actuation of the first gradient coil at a first point in time and/or second actuation information corresponding to an actuation of the second gradient coil at a second point in time, and
based on the first actuation information and/or the second actuation information, assign the flexible gradient amplifier, at the first point in time, to the first gradient coil, and/or, at the second point in time to the second gradient coil.

8. The imaging system as claimed in claim 7, wherein the controller is further configured to detect at least a first specification for the first gradient coil, and to ensure compliance with the first specification upon actuation of the first gradient coil by the flexible gradient amplifier.

9. The imaging system as claimed in claim 6, wherein the gradient system further comprises a first static gradient amplifier and a second static gradient amplifier, the first static gradient amplifier being assigned to the first gradient coil and the second static gradient amplifier being assigned to the second gradient coil.

10. The imaging system as claimed in claim 9, wherein:
a maximum power which can be generated by the flexible gradient amplifier is greater than a maximum power which can be generated by the first static gradient amplifier; and
the maximum power which can be generated by the flexible gradient amplifier is greater than a maximum power which can be generated by the second static gradient amplifier.

11. A method for actuating a gradient system having a first gradient coil, a second gradient coil, a flexible gradient amplifier configured to selectively actuate the first gradient coil and the second gradient coil, a first static gradient amplifier, and a second static gradient amplifier, the first static gradient amplifier being assigned to the first gradient coil and the second static gradient amplifier is being assigned to the second gradient coil, the method comprising:
assigning a first magnetic resonance device to the first gradient coil and assigning a second magnetic resonance device to the second gradient coil;
provisioning first actuation information corresponding to an actuation of the first gradient coil at a first point in time;
determining a first required power for the first gradient coil based on the first actuation information;
comparing the first required power and a maximum power which can be generated by the first static gradient amplifier; and
selectively assigning, based on the comparison, the flexible gradient amplifier to the first gradient coil, to the second gradient coil, and to an idle position.

12. The method as claimed in claim 11, wherein the selective assignment comprises a temporal shift of the first point in time.

13. The method as claimed in claim 11, further comprising:
provisioning second actuation information corresponding to an actuation of the second gradient coil at a second point in time;
determining a second required power for the second gradient coil based on the second actuation information;
comparing the second required power with a maximum power which can be generated by the second static gradient amplifier, wherein the selectively assignment is further based on availability of the flexible gradient amplifier at the first point in time and the second point in time.

14. The method as claimed in claim 13, wherein the selective assignment comprises a temporal shift of the second point in time.

15. A computer program product which comprises a program and is directly loadable into a memory store of a controller, when executed by the controller, causes the controller to perform the method for actuating a gradient system as claimed in claim 11.

16. A non-transitory computer-readable storage medium with an executable program stored thereon, that when executed, instructs a processor to perform the method of claim 11.

17. The method as claimed in claim 11, wherein the first static gradient amplifier is configured to exclusively actuate the first gradient coil unit and the second static gradient amplifier is configured to exclusively actuate the second gradient coil.

18. The method as claimed in claim 11, wherein the first static gradient amplifier is assigned to only the first gradient coil unit and the second static gradient amplifier is assigned to only the second gradient coil.

19. The method as claimed in claim 11, wherein the first gradient coil and the second gradient coil are arranged within different respective rooms of a building.

* * * * *